(12) United States Patent
Kim et al.

(10) Patent No.: US 7,675,158 B2
(45) Date of Patent: Mar. 9, 2010

(54) SEMICONDUCTOR INTEGRATED CIRCUIT INCLUDING A POWER SUPPLY, AND SEMICONDUCTOR SYSTEM INCLUDING A SEMICONDUCTOR INTEGRATED CIRCUIT

(75) Inventors: Kyu-Hyoun Kim, Suwon-si (KR); Chang-Hyun Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 548 days.

(21) Appl. No.: 11/447,943

(22) Filed: Jun. 7, 2006

(65) Prior Publication Data

US 2006/0284302 A1   Dec. 21, 2006

(30) Foreign Application Priority Data

Jun. 18, 2005   (KR) ............ 10-2005-0052739

(51) Int. Cl.
*H01L 23/52* (2006.01)
*H01L 27/04* (2006.01)
*H01L 23/373* (2006.01)
*H01L 21/822* (2006.01)

(52) U.S. Cl. ............... 257/691; 257/E23.012; 257/E23.153; 257/E21.51; 257/700; 257/773; 257/774; 257/775

(58) Field of Classification Search ........... 257/691, 257/700, E23.012, E21.51, E23.153, 773, 257/774, 775, 786, E23.02
See application file for complete search history.

(56) References Cited

U.S. PATENT DOCUMENTS

| 6,181,008 | B1 | 1/2001 | Avery |
| 6,376,909 | B1 | 4/2002 | Forbes et al. |
| 6,781,238 | B2 | 8/2004 | Nonaka |
| 7,342,169 | B2 * | 3/2008 | Venkatasubramanian et al. ........ 136/236.1 |
| 2002/0093029 | A1 | 7/2002 | Ballantine et al. |
| 2003/0070149 | A1 | 4/2003 | Mizumasa |

(Continued)

FOREIGN PATENT DOCUMENTS

KR   1020030003942 A   1/2003

(Continued)

OTHER PUBLICATIONS

Office Action for corresponding German Office Action dated Jan. 9, 2008.

(Continued)

*Primary Examiner*—Alexander O Williams
(74) *Attorney, Agent, or Firm*—Harness, Dickey & Pierce, P.L.C.

(57) ABSTRACT

Provided are a semiconductor integrated circuit including a power supply, a semiconductor system including the semiconductor integrated circuit, and a method of forming the semiconductor integrated circuit. The semiconductor integrated circuit includes: a semiconductor substrate on a surface of which a plurality of electrical circuits and a plurality of power pads are mounted; an insulation layer stacked on the semiconductor substrate; a first conductive layer connected to a first power pad by a first via and stacked on the insulation layer; a second conductive layer connected to a second power pad by a second via, stacked on the insulation layer, and separated from the first insulation layer; and a power generation layer stacked on the first conductive layer and the second conductive layer and that generates voltage.

16 Claims, 7 Drawing Sheets

U.S. PATENT DOCUMENTS

2004/0080481 A1* 4/2004 Yamazaki et al. ............. 345/92
2004/0151014 A1* 8/2004 Speakman ................... 365/49
2007/0077691 A1* 4/2007 Watanabe ................... 438/149

FOREIGN PATENT DOCUMENTS

| TW | 525289 | 3/2003 |
| TW | 534522 | 5/2003 |
| WO | WO 2005/005930 | 1/2005 |

OTHER PUBLICATIONS

Office Action for corresponding Taiwanese Application No. 095120919 dated May 26, 2009 and English translation thereof.

* cited by examiner

SEMICONDUCTOR INTEGRATED CIRCUIT INCLUDING A POWER SUPPLY, AND SEMICONDUCTOR SYSTEM INCLUDING A SEMICONDUCTOR INTEGRATED CIRCUIT

PRIORITY STATEMENT

This application claims the priority of Korean Patent Application No. 10-2005-0052739, filed on Jun. 18, 2005, in the Korean Intellectual Property Office, the entire contents of which is incorporated herein by reference.

BACKGROUND OF THE INVENTION

1. Field of the Invention

Example embodiments of the present invention relate to a semiconductor integrated circuit, a semiconductor system, and a method of forming a semiconductor integrated circuit; and more particularly, to a semiconductor integrated circuit including a power supply, a semiconductor system including the semiconductor integrated circuit, and a method of forming the semiconductor integrated circuit.

2. Description of the Related Art

Conventional semiconductor integrated circuits have increasingly become smaller and more highly integrated. Accordingly, semiconductor integrated circuits having a diversity of functions can be integrated into a single semiconductor system. For example, semiconductor systems used in mobile phones include high-power radio frequency (RF) integrated circuits that require a high voltage of, for example, approximately 3 V, and memory and/or logic integrated circuits that require a low voltage of, for example, approximately 1.2 V.

FIG. 1 illustrates a conventional semiconductor system 100, and FIG. 2 illustrates another conventional semiconductor system 200.

Referring to FIG. 1, a conventional semiconductor system 100 may include a plurality of integrated circuits S_IC1 through S_IC3 that perform different functions and a power supply PS that applies voltage to the integrated circuits S_IC1 through SIC3. The power supply PS may be a self-generating power supply.

Referring to FIG. 2, a conventional semiconductor system 200 may include a plurality of integrated circuits S_IC1 through S_IC3 that perform different functions, a power supply B that applies voltage to the integrated circuits S_IC1 through S_IC3, and a charger C that may supply electric charge to the power supply B.

A power supply B, which is not a self-generating power supply, may receive electric charge from an external source through a charger C and may apply voltage to the integrated circuits S_IC1 through S_IC3.

As illustrated in FIGS. 1 and 2, in conventional semiconductor systems 100, 200, the integrated circuits S_IC1, S_IC2, S_IC3 receive voltage from the shared power supplies PS and B. In the conventional systems 100, 200, the following problems may arise.

Conventionally, power supplies PS, B occupy a large amount of space inside semiconductor systems 100, 200 making it difficult to add more integrated circuits to semiconductor systems 100, 200 without increasing the size of the semiconductor systems and/or to scale down the semiconductor systems 100, 200. Furthermore, because integrated circuits S_IC1, S_IC2, S_IC3 may be disposed close to each other, temperatures inside the conventional semiconductor systems 100, 200 may increase.

As described above, integrated circuits S_IC1, S_IC2, S_IC3 in conventional semiconductor systems 100, 200 share power supplies PS, B. Accordingly, an integrated circuit that consumes most of the power, for example, a CPU, may limit the lifespan of the power supplies PS, B.

For example, in notebooks or mobile phones, a CPU or a transmitting/receiving device typically consumes most of the power. Further, in conventional semiconductor systems 100, 200 as illustrated in FIGS. 1 and 2, the power supplies PS, B provide power for all of the integrated circuits S_IC1, S_IC2, S_IC3, and thus when the power supplies PS, B are exhausted, all of the integrated circuits S_IC1, S_IC2, S_IC3 lose power substantially simultaneously.

Further, because a power supply is shared by integrated circuits that may or may not cause a significant amount of noise and/or integrated circuits that are sensitive and/or insensitive to noise, the overall performance of a semiconductor system may be limited by an integrated circuit having the worst noise characteristics.

SUMMARY OF THE INVENTION

An example embodiment of the present invention provides a semiconductor integrated circuit including a dedicated power supply.

An example embodiment of the present invention provides a semiconductor system including a plurality of semiconductor integrated circuits, each including a dedicated power supply.

An example embodiment of the present invention provides a method of forming a semiconductor integrated circuit including a dedicated power supply.

An example embodiment of the present invention provides a semiconductor integrated circuit. The semiconductor integrated circuit may include a semiconductor substrate on a surface of which a plurality of electrical circuits and a plurality of power pads are mounted; an insulation layer stacked on the semiconductor substrate; a first conductive layer connected to a first power pad by a first via and stacked on the insulation layer; a second conductive layer connected to a second power pad by a second via, stacked on the insulation layer, and separated from the first conductive layer; and a power generation layer which is stacked on the first conductive layer and second conductive layer and generates voltage.

According to an example embodiment of the present invention, a first conductive layer and a first via form a first integrated wiring structure, and a second conductive layer and a second via form a second integrated wiring structure.

According to an example embodiment of the present invention, a power generation layer may be a material that generates voltage on its own. One of the power pads is a power supply pad, and another of the power pads is connected to a ground.

An example embodiment of the present invention provides a semiconductor integrated circuit. The semiconductor integrated circuit may include a semiconductor substrate on a surface of which a plurality of electrical circuits and a plurality of power pads are mounted; a first insulation layer stacked on the semiconductor substrate; a first conductive layer which is connected to a first power pad by a first via and stacked on the first insulation layer; a second conductive layer which is connected to a second power pad by a second via, stacked on the first insulation layer, and separated from the first conductive layer; a second insulation layer stacked on the first conductive layer and the second conductive layer; and a third conductive layer which is connected to the first conductive layer by a third via and stacked on the second insulation layer.

According to an example embodiment of the present invention, a first conductive layer, a second conductive layer, a third conductive layer, and a second insulation layer form a capacitor.

An example embodiment of the present invention provides a semiconductor integrated circuit. The semiconductor integrated circuit may include a semiconductor substrate on a surface of which a plurality of electrical circuits and a plurality of power pads are mounted; an insulation layer stacked on the semiconductor substrate; and a battery which is stacked on the insulation layer and applies voltage to the power pads through a via. The battery may be a solar cell and/or a material that self-generates voltage.

An example embodiment of the present invention provides a semiconductor integrated circuit. The semiconductor integrated circuit may include a semiconductor substrate on a surface of which a plurality of electrical circuits and a plurality of power pads are mounted; an insulation layer stacked on the semiconductor substrate; and a capacitor which is stacked on the insulation layer, stores electric charge supplied from an external source, and applies voltage to the power pads through a via.

An example embodiment of the present invention provides a semiconductor system. The semiconductor system may include a plurality of semiconductor integrated circuits, wherein each semiconductor integrated circuit includes a voltage generator which applies an appropriate voltage to a corresponding power pad through a via.

According to an example embodiment of the present invention, a power provider may be a battery or a material that self-generates voltage. The power provider may be a capacitor and/or a carbon nano-tube which stores electric charge supplied from an external source and applies voltage to the power pads through a via.

According to an example embodiment of the present invention, a semiconductor system may further include an electric charge generator which supplies electric charge to the power provider.

An example embodiment of the present invention provides a method for forming a semiconductor integrated circuit. The method may include a forming a plurality of electrical circuits and a plurality of power pads on a semiconductor substrate; forming an insulation layer on the semiconductor substrate; forming a first conductive layer which is connected to a first power pad by a first via on the insulation layer; forming a second conductive layer on the insulation layer, wherein the second conductive layer is connected to a second power pad by a second via and separated from the first conductive layer; and forming a power provider for generating voltage on the first conductive layer and the second conductive layer.

An example embodiment of the present invention provides a method for forming a semiconductor integrated circuit. The method may include forming a plurality of electrical circuits and a plurality of power pads on a semiconductor substrate; forming a first insulation layer on the semiconductor substrate; forming a first conductive layer which is connected to a first power pad by a first via on the first insulation layer; forming a second conductive layer on the first insulation layer, wherein the second conductive layer is connected to a second power pad by a second via and separated from the first conductive layer; forming a second insulation layer on the first conductive layer and the second conductive layer; and forming a third conductive layer on second insulation layer, wherein the third conductive layer is connected to the first conductive layer by a third via.

An example embodiment of the present invention provides a semiconductor system. The semiconductor system may include at least one semiconductor substrate; a plurality of electrical circuits and a plurality of power pads arranged on each of the at least one semiconductor substrate; an insulation layer arranged on the at least one semiconductor substrate and the plurality of electrical circuits and the plurality of power pads; at least one conductive layer arranged on the insulation layer; and a power provider arranged on the at least one conductive layer and configured to provide power to at least one of the plurality of power pads.

BRIEF DESCRIPTION OF THE DRAWINGS

The above and/or other features and/or advantages of the present invention will become more apparent by describing in detail example embodiments of the present invention with reference to the attached drawings in which.

DETAILED DESCRIPTION OF EXAMPLE EMBODIMENTS OF THE PRESENT INVENTION

Figure 1:
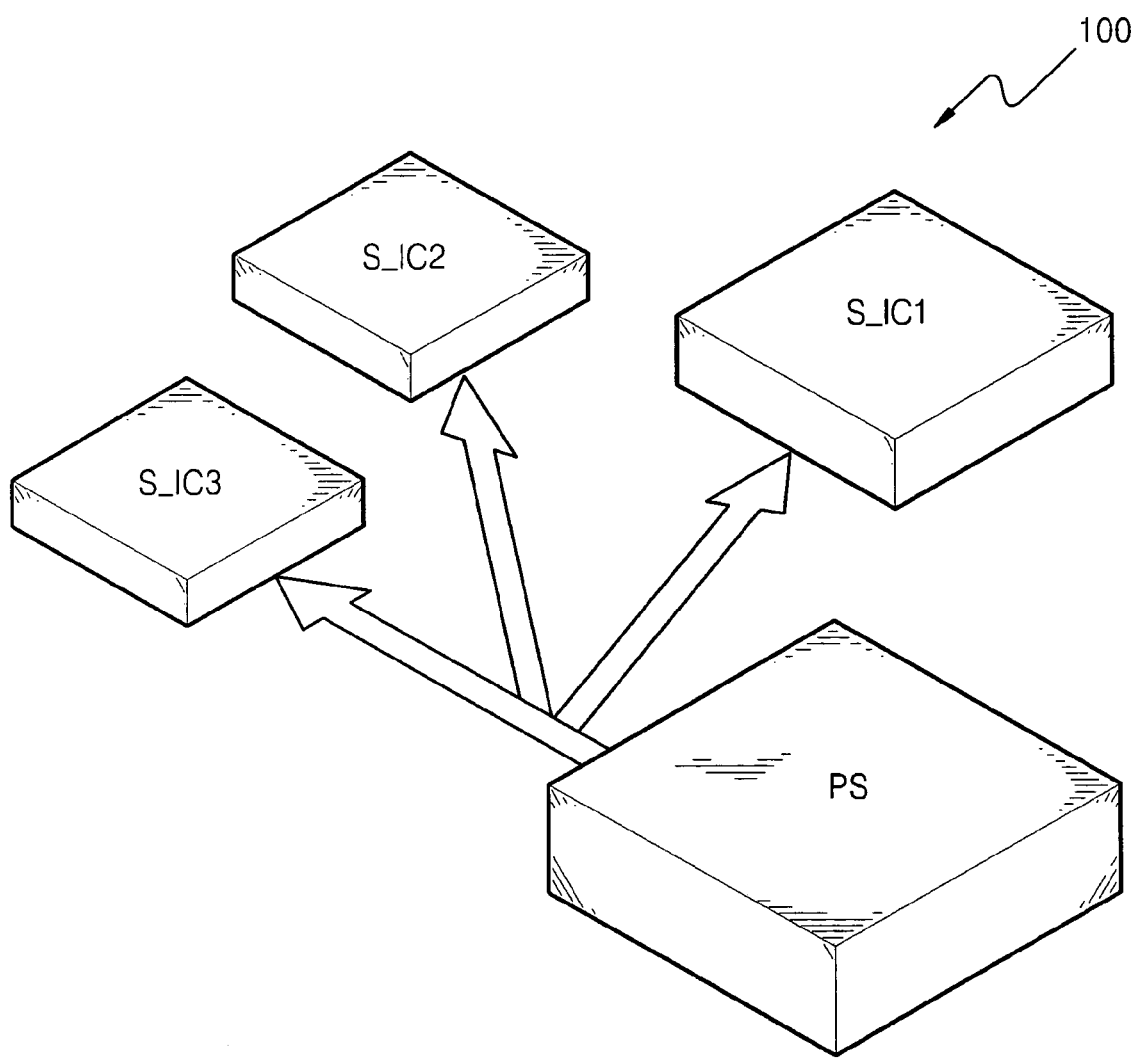
FIG. 1 illustrates a conventional semiconductor system.
Figure 2:
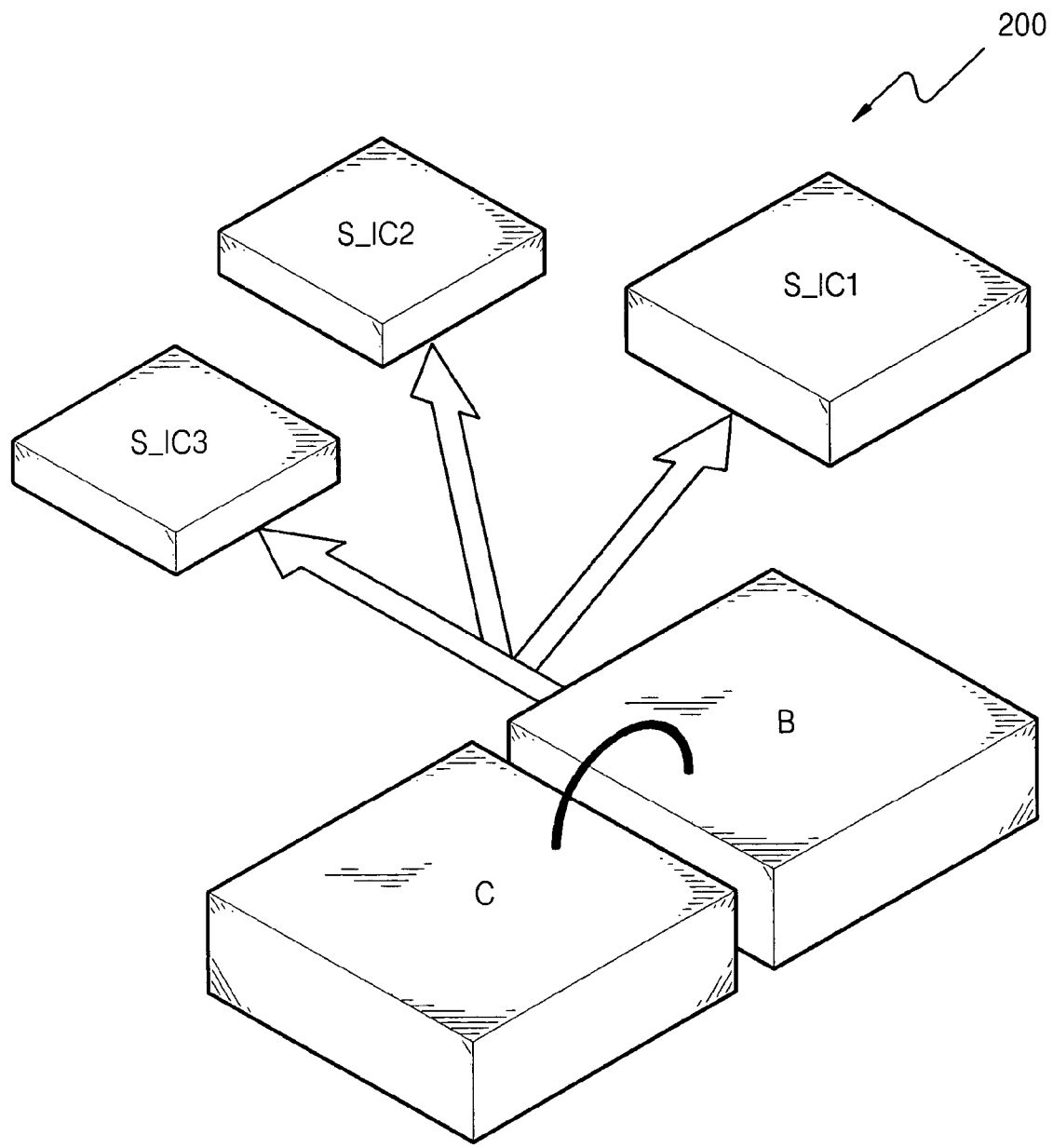
FIG. 2 illustrates a conventional semiconductor system.

Various example embodiments of the present invention will now be described more fully with reference to the accompanying drawings in which some example embodiments of the invention are shown. In the drawings, the thicknesses of layers and/or regions may be exaggerated for clarity.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 3:
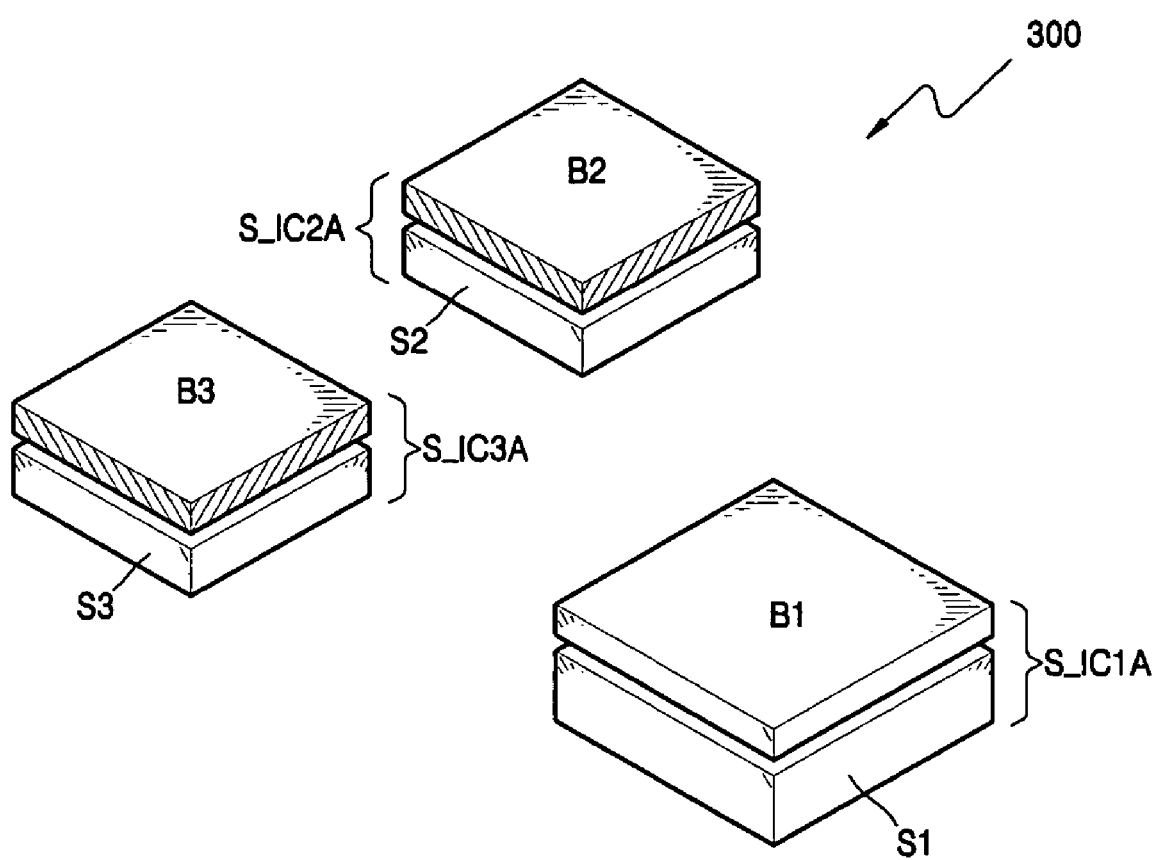
FIG. 3 illustrates a semiconductor system according to an example embodiment of the present invention.

FIG. 3 illustrates a semiconductor system 300 according to an example embodiment of the present invention. Referring to FIG. 3, a semiconductor system 300 may include a plurality of semiconductor integrated circuits S_IC1A, S_IC2A, S_IC3A. Because all semiconductor integrated circuits S_IC1A, S_IC2A, S_IC3A may have a similar and/or identical structure, the structure and operation of semiconductor integrated circuit S_IC1A will be described as an example.

Referring to FIG. 3, a semiconductor integrated circuit S_IC1A may include a semiconductor substrate SUB (see FIG. 4) on a surface of which a plurality of electrical circuits 41 (see FIG. 4) and power pads VCC_P, GND_P (see FIG. 4) may be mounted; an insulation layer I1 (see FIG. 4) that may be stacked on the semiconductor substrate SUB; and a battery B1 which may be stacked on the insulation layer I1 and may apply voltage to power pads VCC_P, GND_P through vias V1, V2 (see FIG. 4). The semiconductor substrate SUB and insulation layer I1 are collectively indicated as reference numeral S1 (see FIG. 4).

A battery B1 may be a solar power battery and/or a material that may self-generate voltage.

According to an example embodiment of the present invention, a semiconductor integrated circuit S_IC1A may include a power provider (e.g., a voltage generator) that provides power to the semiconductor integrated circuit S_IC1A.

In an example embodiment of the present invention, because semiconductor integrated circuits S_IC1A, S_IC2A, S_IC3A do not share a common voltage generator, the lifespan of each voltage generator may vary according to the usage of each semiconductor integrated circuit. Accordingly, overall noise characteristics of a semiconductor system 300 according to an example embodiment of the present invention may not be affected by the noise characteristics of each semiconductor integrated circuit.

In addition, because voltage generators may be included in and/or arranged on each semiconductor integrated circuit in a semiconductor system according to an example embodiment of the present invention, the size of a semiconductor system 300 may be reduced and/or more semiconductor chips may be integrated into semiconductor system 300. The structure and operation of semiconductor integrated circuit S_IC1A according to an example embodiment of the present invention will be further described with reference to FIGS. 4A through 4C.

Figure 4A:
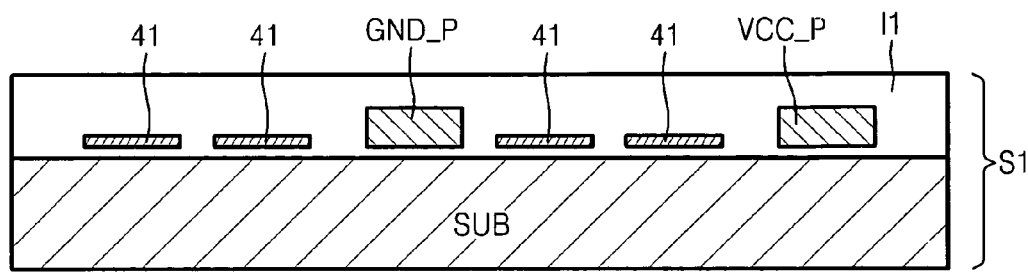
FIGS. 4A through 4C illustrate a method of forming a semiconductor integrated circuit according to an example embodiment of the present invention.
Figure 4B:
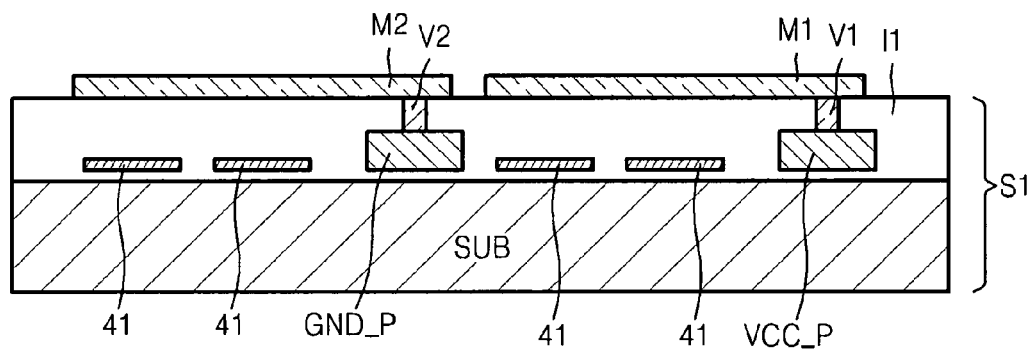
Figure 4C:
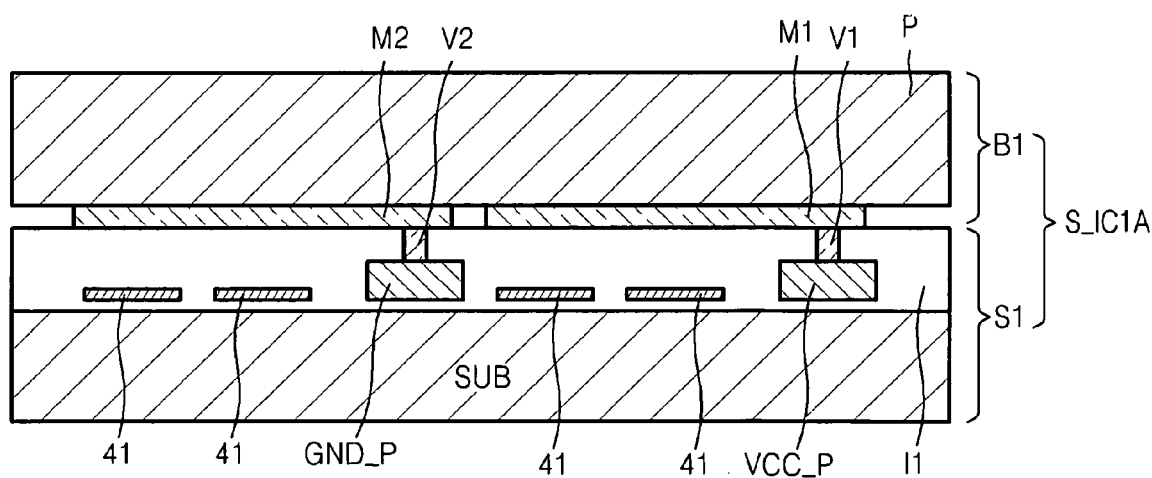

FIGS. 4A through 4C illustrate a method of forming a semiconductor integrated circuit S_IC1A of FIG. 3 according to an example embodiment of the present invention.

Referring to FIGS. 3 and 4A through 4C, a semiconductor integrated circuit S_IC1A may include a semiconductor substrate SUB on a surface of which electrical circuits 41 and power pads VCC_P, GND_P may be mounted; an insulation layer I1 which may be stacked on the semiconductor substrate SUB; a first conductive layer M1 which may be connected to a first power pad VCC_P by via V1 and stacked on the insulation layer I1; a second conductive layer M2 which may be connected to a second power pad GND_P by via V2, stacked on insulation layer I1, and separated from the first conductive layer M1; and a power generation layer P which may be stacked on the first and second conductive layers M1, M2 and may generate voltage.

According to an example embodiment of the present invention, electrical circuits 41 and power pads VCC_P, GND_P may be formed on a semiconductor substrate SUB (see FIG. 4A). The electrical circuits 41 may be logic circuits that implement functions of a semiconductor integrated circuit S_IC1A. The first power pad VCC_P may be a power supply pad and the second power pad GND_P may be connected to a ground.

An insulation layer I1 may be formed on the electrical circuits 41 and the power pads VCC_P, GND_P (see FIG. 4A). A first conductive layer M1 connected to a first power pad VCC_P by a via V1 may be formed on the insulation layer I1 (see FIG. 4B). The first conductive layer M1 and the via V1 connected to the first conductive layer M1 may form a first integrated wiring structure.

Because a method of forming the via V1 and first conductive layer M1 on the insulation layer I1 to form a first integrated wiring structure is known to those of ordinary skill in the art, a detailed description thereof is omitted herein for the sake of brevity.

A second conductive layer M2 connected to a second power pad GND_P, which, in turn, may be connected to ground by a via V2 and separate from a first conductive-layer M1 may be formed on insulation layer I1 (see FIG. 4B). The second conductive layer M2 and via V2 connected to the second conductive layer M2 may form a second integrated wiring.

Because a method of forming a via V2 and a second conductive layer M2 on the insulation layer I1 to form the second integrated wiring is known to those of ordinary skill in the art, its detailed description is also omitted for the sake of brevity.

First conductive layer M1 and second conductive layer M2 may be conductive metallic materials and/or equivalents thereof.

According to an example embodiment of the present invention, a power generation layer P that generates voltage may be formed on the first and second conductive layers M1, M2 (see FIG. 4C). A power generation layer P may be a material that self-generates, for example, the power generation layer P may be a solar cell.

A power generation layer P may generate a voltage on its own and may apply the voltage to a first power pad VCC_P through a first conductive layer M1 and a via V1. A voltage applied to a first power pad VCC_P of a semiconductor integrated circuit S_IC1A by a power generation layer P may be used to operate electrical circuits 41 of a semiconductor integrated circuit S_IC1A. A power generation layer P and first and second conductive layers M1, M2 may collectively form a battery B1 as illustrated in an example embodiment of the present invention as shown in FIG. 3.

According to an example embodiment of the present invention, a semiconductor integrated circuit S_IC1A having a structure as described above may vary the lifespan of power generation layer P according to functions of the semiconductor integrated circuit S_IC1A.

Figure 5:
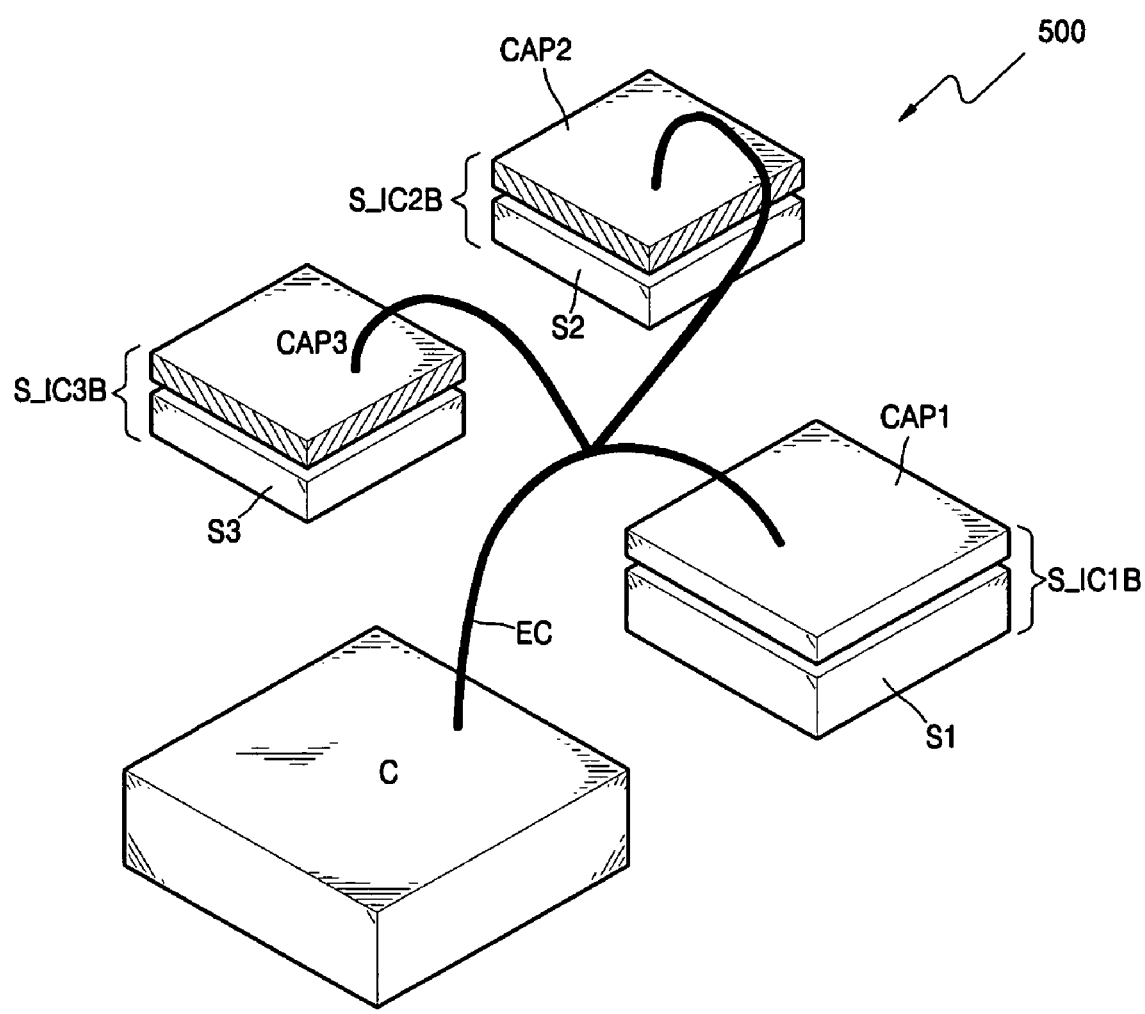
FIG. 5 illustrates a semiconductor system according to an example embodiment of the present invention.

FIG. 5 illustrates a semiconductor system according to an example embodiment of the present invention. Referring to FIG. 5, a semiconductor system 500 may include a plurality of semiconductor integrated circuits S_IC1B, S_IC2B, S_IC3B and an electric charge generator C that may supply electric charge to the semiconductor integrated circuits S_IC1B, S_IC2B, S_IC3B through a conductive signal line EC. The conductive signal line EC may be a patterned printed circuit board (PCB) patterned on a motherboard (not shown) mounting semiconductor integrated circuits S_IC1B, S_IC2B, S_IC3B and/or an equivalent conductive transmission line.

Unlike the semiconductor integrated circuits S_IC1A, S_IC2A, S_IC3A of an example embodiment of the present invention shown in FIG. 3, semiconductor integrated circuits S_IC1B. S_IC2B, S_IC3B as shown in FIG. 5 may receive electric charge from an external electric charge generator C. According to an example embodiment of the present invention, the semiconductor integrated circuits S_IC1B, S_IC2B, S_IC3B may receive and store electric charge and may generate voltage. An electric charge generator C may be any device that generates electric charge on its own and/or receives electric charge from an external source and supplies the electric charge to the power pads of a semiconductor integrated circuit S_IC1B. A charger for charging mobile devices, for example, mobile phones is one example of an electric charge generator.

Because each of the semiconductor integrated circuits S_IC1B, S_IC2B S_IC3B may have a similar and/or identical structure according to an example embodiment of the present invention, a structure and operation of a semiconductor integrated circuit S_IC1B will be described as an example.

Referring to FIG. 5, a semiconductor integrated circuit S_IC1B may include a semiconductor substrate SUB (see FIG. 6) on a surface of which electrical circuits 61 (see FIG. 6) and power pads VCC_P, GND_P (see FIG. 6) may be mounted; a first insulation layer I1, (see FIG. 6) which may be stacked on the semiconductor substrate SUB; and a capacitor CAP1 which may be stacked on the first insulation layer I1, may store electric charge supplied from an external source, and may apply voltage to power pads VCC_P, GND_P through vias V1, V2, V3. In FIG. 5, a semiconductor substrate SUB and a first insulation layer I1 are collectively indicated as reference numeral S1.

In a semiconductor integrated circuit S_IC1B according to an example embodiment of the present invention, a power provider (e.g., voltage generator), which may receive and store electric charge supplied from an external source and may generate and/or apply a voltage to the semiconductor integrated circuit S_IC1B, is mounted on a semiconductor chip. A voltage generator according to an example embodiment of the present invention may be a capacitor and/or a carbon nano tube.

In an example embodiment of the present invention as shown in FIG. 5, because semiconductor integrated circuits S_IC1B, S_IC2B, S_IC3B do not share a voltage generator, the lifespan of each voltage generator may vary according to the usage of each semiconductor integrated circuit. Accordingly, the overall noise characteristics of semiconductor system 500 may not be affected by the noise characteristics of each semiconductor integrated circuit within the semiconductor system 500.

In addition, because the voltage generators are included and/or arranged on each semiconductor integrated circuit, the size of the semiconductor system 500 may be reduced and/or more semiconductor circuits may be integrated into semiconductor system 500. The structure and operation of a semiconductor integrated circuit S_IC1B according to an example embodiment of the present invention will be further described with reference to FIG. 5.

Figure 6A:
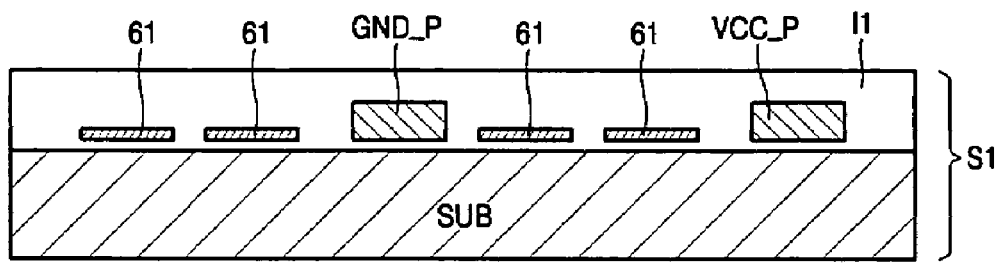
FIGS. 6A through 6C illustrate a method of forming a semiconductor integrated circuit according to an example embodiment of the present invention.
Figure 6B:
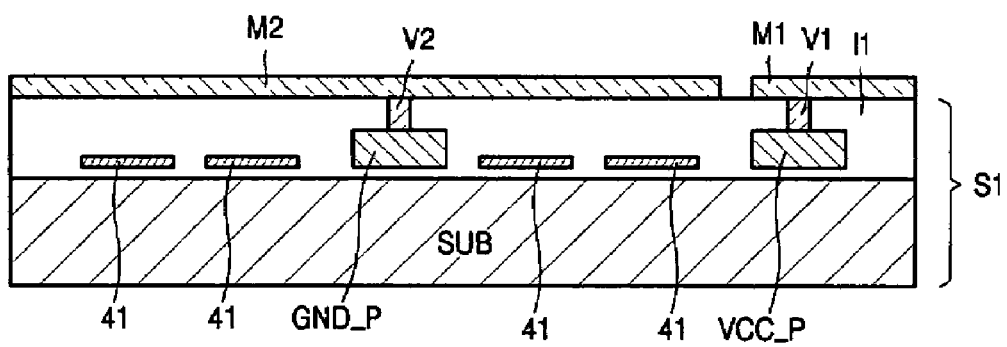
Figure 6C:
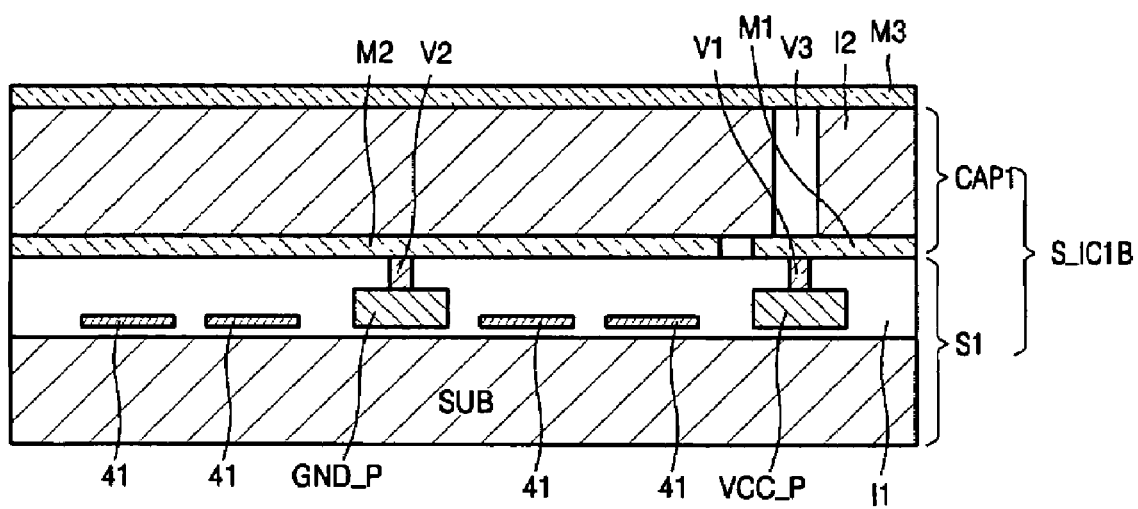

FIGS. 6A through 6C illustrate a method of forming semiconductor integrated circuit S_IC1B of FIG. 5 according to an example embodiment of the present invention.

Referring to FIGS. 5 and 6A through 6C, a semiconductor integrated circuit S_IC1B may include a semiconductor substrate SUB on the surface of which electrical circuits 61 and power pads VCC_P, GND_P may be mounted; a first insulation layer I1 which may be stacked on the semiconductor substrate SUB; a first conductive layer M1 which may be connected to a first power pad VCC_P by a via V1 and may be stacked on the first insulation layer I1; a second conductive layer M2 which may be connected to a second power pad GND_P by a via V2, stacked on the first insulation layer I1, and separated from the first conductive layer M1; second insulation layer I2 which may be stacked on the first conductive layer M1 and the second conductive layer M2; and a third conductive layer M3 which may be connected to the first conductive layer M1 by a via V3 and may be stacked on the second conductive layer M2.

According to an example embodiment of the present invention, electrical circuits 61 and power pads VCC_P, GND_P may be formed on the semiconductor substrate SUB (see FIG. 6A). The electrical circuits 61 may be logic circuits that may implement functions of a semiconductor integrated circuit S_IC1B. A first power pad VCC_P may be a power supply pad and a second power pad GND_P may be connected to a ground.

A first insulation layer I1 may be formed on the electrical circuits 61 and the power pads VCC_P, GND_P (see FIG. 6A). A first conductive layer M1 connected to a first power pad VCC_P by a via V1 may be formed on a first insulation layer I1 (see FIG. 6B). The first conductive layer M1 and the via V1 connected to the first conductive layer M1 may form a first integrated wiring structure.

Because a method of forming the via V1 and the first conductive layer M1 on the first insulation layer I1 to form the first integrated wiring structure is known to those of ordinary skill in the art, a detailed description thereof is omitted herein for the sake of brevity.

A second conductive layer M2, which may be connected to a second power pad GND_P by a via V2 and separated from the first conductive layer M1, may be formed on the first insulation layer I1 (see FIG. 6B). The second conductive layer M2 and the via V2 connected to the second conductive layer M2 may form a second integrated wiring structure.

Because a method of forming the via V2 and the second conductive layer M2 on the first insulation layer I1 to form the second integrated wiring is known to those of ordinary skill in the art, a detailed description thereof is also omitted herein.

The first conductive layer M1 and the second conductive layer M2 may be conductive metallic materials and/or their equivalents. A method of forming a semiconductor integrated circuit S_IC1B according to an example embodiment of the present invention as shown in FIGS. 6A and 6B may be similar and/or identical to the method of forming semiconductor integrated circuit S_IC1A illustrated in FIGS. 4A and 4B.

According to an example embodiment of the present invention as shown in FIG. 6C, a second insulation layer I2 may be formed on first and second conductive layers M1, M2. A third conductive layer M3, which may be connected to first conductive layer M1 by a via V3 may be formed on the second insulation layer I2.

The third conductive layer M3 and the via V3 connected to the third conductive layer M3 may form a third integrated wiring structure. Because a method of forming the via V3 and the third conductive layer M3 on the second insulation layer I2 to form the third integrated wiring structure is known to those of ordinary skill in the art, a detailed description thereof is omitted. The third conductive layer M3 may be a conductive metallic material and/or its equivalent.

According to an example embodiment of the present invention, the first through third conductive layers M1, M2, M3 and second insulation layer I2 may combine to form a capacitor CAP1 as illustrated in FIG. 5. Accordingly, the first through third conductive layers M1, M2, M3 and the second insulation layer I2 may be structured similar and/or identical to the structure of capacitor CAP1 including an insulating material between two charged plates.

A capacitor CAP1 may receive and store electric charge from an electric charge generator C and may generate a voltage. A capacitor CAP1 may apply a voltage to a first power pad VCC_P through a first conductive layer M1 and a via V1. A voltage applied to a first power pad VCC_P may be used to operate electrical circuits 61.

A semiconductor integrated circuit S_IC1B having a structure in accordance with an example embodiment of the present invention may control a period of time during which voltage may be generated by adjusting an amount of electric charge stored in capacitor CAP1 according to a function of the semiconductor integrated circuit S_IC2B.

Figure 7:
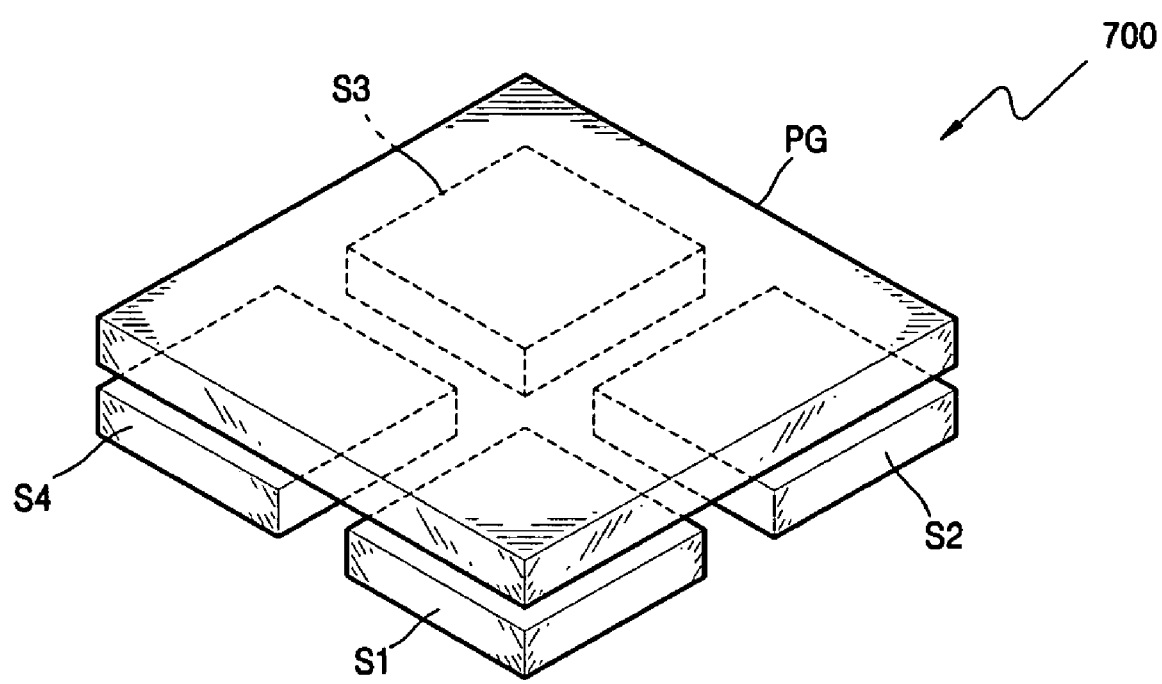
FIG. 7 illustrates a semiconductor integrated circuit according to an example embodiment of the present invention.

FIG. 7 illustrates a semiconductor integrated circuit 700 according to an example embodiment of the present invention. In example embodiments of the present invention as shown in FIGS. 3 and 5, semiconductor integrated circuits S_IC1A, S_IC2A, S_IC3A, S_IC1B, S_IC2B, S_IC3B having batteries B1, B2, B3 and/or capacitors CAP1, CAP2, CAP3, e.g., voltage generators, are illustrated. However, the technical spirit of the present invention is not confined to semiconductor integrated circuits S_IC1A, S_IC2A, S_IC3A, S_IC1B, S_IC2B, S_IC3B illustrated in the example embodiments of the present invention as shown in FIGS. 3 and 5.

In other words, the technical sprit of the present invention may be embodied in a semiconductor integrated circuit 700 of an example embodiment of the present invention as shown in FIG. 7, in which a voltage generator PG may be stacked on a plurality of semiconductor chips S1, S2, S3, S4.

Voltage generator PG, batteries B1, B2, B3 illustrated in an example embodiment of the present invention in FIG. 3, and capacitors CAP1, CAP2, CAP3 illustrated in an example embodiment of the present invention in FIG. 5 may be formed of similar and/or identical material and have similar and/or identical functions.

Apart from the embodiments illustrated in example embodiments of the present invention as shown in FIGS. 4, 5, and 7, the technical spirit of the present invention may also be applied to a plurality of semiconductor chips mounted on a memory module through appropriate modifications.

As described above, according to a semiconductor integrated circuit, a semiconductor system including the same, and a method of forming the semiconductor integrated circuit, an independent voltage generator may be stacked on each semiconductor circuit. Thus, the lifespan of the voltage generator may vary according to the usage of each semiconductor circuit, and the size of the semiconductor system may be reduced.

Although the example embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A plurality of semiconductor integrated circuits, each of the plurality of the semiconductor integrated circuits comprising:
   a semiconductor substrate;
   a plurality of electrical circuits and a plurality of power pads mounted on the semiconductor substrate;
   an insulation layer stacked on the semiconductor substrate; and
   a voltage provider,
   wherein each voltage provider includes,
      a first conductive layer connected to a first power pad by a first via and stacked on the insulation layer,
      a second conductive layer connected to a second power pad by a second via, stacked on the insulation layer and separated from the first conductive layer, and
      a power provider stacked on the first conductive layer and the second conductive layer, and configured to provide power to at least one of the plurality of power pads.

2. The plurality of semiconductor integrated circuits of claim 1, wherein, in each of the plurality of the semiconductor circuits, the first conductive layer and the first via form a first integrated wiring structure, and the second conductive layer and the second via form a second integrated wiring structure.

3. The plurality of semiconductor integrated circuits of claim 1, wherein, in each of the plurality of the semiconductor circuits, the power provider is a material that generates voltage.

4. The plurality of semiconductor integrated circuits of claim 1, wherein, in each of the plurality of the semiconductor circuits, the first power pad is a power supply pad, and the second power pad is connected to a ground.

5. The circuit of claim 1, wherein the power provider is a battery.

6. The circuit of claim 5, wherein the battery is a solar cell.

7. A semiconductor system comprising:
   a plurality of the semiconductor integrated circuits of claim 1, wherein the voltage provider of each of the plurality of semiconductor integrated circuit applies an appropriate voltage to a corresponding power pad through a via.

8. The system of claim 7, wherein the voltage provider is at least one of a battery and a material that generates voltage.

9. The system of claim 8, wherein the voltage provider of each semiconductor integrated circuit is at least one of a capacitor and a carbon nano-tube which stores electric charge supplied from an external source and applies voltage to the corresponding power pad through the via.

10. The system of claim 9, further comprising:
    an electric charge generator which supplies electric charge to the voltage provider.

11. A semiconductor system comprising:
    a plurality of semiconductor integrated circuits,
    wherein each of the plurality of the semiconductor integrated circuits includes, at least one semiconductor substrate, a plurality of electrical circuits and a plurality of power pads arranged on each of the at least one semiconductor substrate, an insulation layer arranged on the at least one semiconductor substrate and the plurality of electrical circuits and the plurality of power pads, and a voltage provider, wherein each voltage provider includes, at least one conductive layer arranged on the insulation layer, and a power provider arranged on the at least one conductive layer and configured to provide power to at least one of the plurality of power pads.

12. The semiconductor system of claim 11, wherein the power provider is a battery.

13. The semiconductor system of claim 12, wherein the battery is a solar cell.

14. The semiconductor system of claim 11, wherein the power provider is a capacitor.

15. The semiconductor system of claim 14, wherein the capacitor includes the at lest one conductive layer arranged on the insulation layer as a bottom electrode; a dielectric layer arranged on the bottom electrode; and an upper electrode arranged on the dielectric layer.

16. The semiconductor system of claim 14, wherein the capacitor is configured to store electric charge supplied from an external source and discharge stored electric charge to the at least one of the plurality of power pads.

* * * * *